(12) United States Patent
Vergauwen

(10) Patent No.: US 12,206,428 B2
(45) Date of Patent: Jan. 21, 2025

(54) SENSOR INTERFACES FOR FUNCTIONAL SAFETY APPLICATIONS

(71) Applicant: Melexis Technologies NV, Tessenderlo (BE)

(72) Inventor: Johan Vergauwen, Tessenderlo (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 323 days.

(21) Appl. No.: 17/724,198

(22) Filed: Apr. 19, 2022

(65) Prior Publication Data

US 2022/0337263 A1 Oct. 20, 2022

(30) Foreign Application Priority Data

Apr. 20, 2021 (EP) .................................... 21169537

(51) Int. Cl.
*H03M 1/10* (2006.01)
(52) U.S. Cl.
CPC ................................ *H03M 1/1071* (2013.01)
(58) Field of Classification Search
CPC .. H03M 1/1071; A61B 5/0507; A61B 5/0033; A61B 5/004; A61B 2562/046; A61B 5/4312; G01S 7/02; G01S 13/89; G01S 7/032
USPC ....... 324/500, 537, 329–348, 323, 447, 425, 324/200, 206, 256–259, 600, 637, 639, 324/658, 750.12, 76.11, 144
See application file for complete search history.

(56) References Cited

U.S. PATENT DOCUMENTS

| | | | |
|---|---|---|---|
| 8,442,787 B2 * | 5/2013 | Ausserlechner | G01N 27/72 702/65 |
| 9,001,446 B1 * | 4/2015 | Wilson | G11B 5/59616 360/39 |
| 9,304,958 B2 | 4/2016 | Kreuzer | |
| 9,346,441 B2 | 5/2016 | Rasbornig et al. | |
| 9,804,222 B2 * | 10/2017 | Petrie | G01R 33/07 |
| 9,874,609 B2 | 1/2018 | Rasbornig et al. | |

(Continued)

FOREIGN PATENT DOCUMENTS

| | | |
|---|---|---|
| DE | 102012201170 A1 | 8/2013 |
| DE | 102011017698 B4 | 10/2014 |
| WO | 0055652 A1 | 9/2000 |

OTHER PUBLICATIONS

Extended European Search Report from European Application No. 21169537.4 mailed Oct. 12, 2021.

*Primary Examiner* — Raul J Rios Russo
*Assistant Examiner* — Trung Q Nguyen
(74) *Attorney, Agent, or Firm* — Workman Nydegger

(57) ABSTRACT

A sensor interface circuit includes at least two sensor inputs and at least two front-end circuits to obtain sensor signal acquisitions from the at least two sensor inputs; a test circuit configured to test correct functionality of at least part of one of the front end circuits by applying a test input to the front end circuit under test, by reading a test output of the front end circuit, and by comparing the test output with an expected result thus obtaining at least one test result. The test input is applied intermittently between sensor signal acquisitions; a processing device is configured to compare the sensor signal acquisitions from the different sensor inputs and combine the comparison with the at least one test result to evaluate correct functionality of the sensor interface circuit.

15 Claims, 4 Drawing Sheets

(56) References Cited

U.S. PATENT DOCUMENTS

| | | | |
|---|---|---|---|
| 2008/0103705 A1* | 5/2008 | Hammerschmidt | G08C 25/00 702/33 |
| 2011/0270553 A1 | 11/2011 | Ausserlechner et al. | |
| 2013/0205866 A1 | 8/2013 | Brockhaus | |
| 2013/0241540 A1 | 9/2013 | Ausserlechner et al. | |
| 2016/0139199 A1 | 5/2016 | Petrie et al. | |
| 2019/0377053 A1* | 12/2019 | Peev | G01R 33/07 |

\* cited by examiner

SENSOR INTERFACES FOR FUNCTIONAL SAFETY APPLICATIONS

FIELD OF THE INVENTION

The invention relates to the field of sensors. More specifically it relates to a sensor interface circuit to be used in functional safety applications.

BACKGROUND OF THE INVENTION

In safety critical applications, such as for example automotive applications it important that the obtained sensor data is reliable, and it is important that incorrect sensor data is identified. In the automotive sector automotive safety integrity levels are defined in a standard, such as ISO26262.

Often at least two sensors are used for measuring the same physical parameter. This may for example be a pressure. Typically, these two sensors are read-out with a sensor interface circuit comprising two separate analog front-ends, like illustrated with the sensor interface circuit 10 in FIG. 1. A first analog front end AFE1 has input pins 11, 12 and a ground input pin 13. A second analog front end AFE2 has input pins 14, 15 and a ground input pin 16. The outputs of the analog front ends are connected with a digital module DM which does the analog to digital conversion and possibly also digital processing. In this example the output of the digital module is connected with an analog back end ABE the output of which is connected with an output pin 17. Alternatively, two ABEs may output both outputs of the AFEs. The analog front ends, the digital module and the analog back end are powered with a power supply system PS which can be powered via interface 16.

In these types of sensor systems one signal (e.g., measured by analog front-end 1) is used as primary output. In these types of sensor systems, the secondary signal may be used to check by digital processing the correctness of the primary signal. In case of two ABEs the check may be done by an external control unit (ECU).

Examples of prior art solutions for dual path sensor arrangements are disclosed in U.S. Pat. No. 9,346,441B2 or U.S. Pat. No. 9,874,609B2 in which a monolithic integrated circuit sensor system implemented on a single semiconductor chip includes a first sensor device having a first signal path for a first sensor signal on a semiconductor chip; and a second sensor device having a second signal path for a second sensor signal on the semiconductor chip, the second signal path distinct from the first signal path, wherein a comparison of the first signal path signal and the second signal path signal provides a sensor system self-test.

However, both prior art solutions relate to monolithic integration of the two sensors and the signal paths. In many situations a monolithic integration is not possible or beneficial, e.g., when the sensor chip uses a different manufacturing technology from the interface chip. One example of such a situation is when the sensor is manufactured using a MEMS technology with small number of metal layers (e.g., 1 or 2 metal layers) for connections and the interface chip uses CMOS technology with more than 6 metal layers. In these situations, each sensor chip needs to be connected to the interface chip outside the dies of the sensor chips, for instance using electrical connections (e.g., pads). When using such longer electrical connections which interconnect the sensor chips with the interface chip, the signal from the sensor becomes sensitive to electromagnetic compatibility (EMC) events, which may distort the sensor output signal.

Very often the same or nearly the same design is used for both analog front-ends. Although this helps to increase the safety level, it can still suffer from common cause faults like design weaknesses, fabrication process weaknesses, EMC events, mechanical stress. Some diversity could be created by swapping the polarity of the differential inputs, e.g., the input and the output of the first analog front-end increases when the physical parameter increases, while the input and output of the second analog front-end decreases. Still, this might not be sufficient.

Alternatively, one can use 2 completely diverse analog front-ends. This can reduce the common cause faults, but it doubles the design efforts. Furthermore, it might be complicated to make the designs truly diverse, e.g., they might use the same kind of components.

For the above reasons there is still a need to find solutions how to detect common cause problems.

SUMMARY OF THE INVENTION

It is an object of embodiments of the present invention to provide a good sensor interface circuit and method which can give an indication concerning the correct functionality (e.g., performance) of the sensor interface circuit.

The above objective is accomplished by a method and device according to the present invention.

In a first aspect embodiments of the present invention relate to a sensor interface circuit which comprises:
- at least two sensor inputs each configured to be connected to a separate sensor for measuring a same physical parameter,
- at least two front-end circuits, wherein each sensor input is configured to be connected with one of the front end circuits, and wherein each front end circuit is configured for conditioning a signal from the connected sensor input, thus obtaining sensor signal acquisitions from the at least two sensor inputs,
- a test circuit configured to test correct functionality (e.g. by checking if the performance meets a predefined requirement) of at least part of one of the front end circuits by applying a test input to the front end circuit under test, by reading a test output of the front end circuit, wherein the test output is induced by the test input, and by comparing the test output with an expected result thus obtaining at least one test result, wherein the test input is applied intermittently between sensor signal acquisitions,
- a processing device configured for comparing the sensor signal acquisitions from the different sensor inputs and for combining the comparison with the at least one test result in order to evaluate correct functionality of the sensor interface circuit.

It is an advantage of embodiments of the present invention that the safety integrity level can be increased by the test circuit while at the same time maintaining the redundancy of at least two front end circuits.

It is an advantage of embodiments of the present invention that problems relating to the signal path from the sensors to the output of the front-end circuit can be detected. This testing, by the test circuit may be done before the signal is converted to a digital signal or more preferably after converting it to a digital signal (as it is easier, and results in a potentially better testing of the performance). This testing is particularly advantageous when the sensor and the sensor interface circuit are on separate dies. In those situations, the signal path for the interface die starts from the input pins which connect the interface die to the sensor die, and the signal paths inside the interface die comprises an analog front-end circuit. It is an advantage of embodiments of the present invention that the safety integrity level of the sensor interface circuit is increased, compared to a sensor interface circuit which does not comprise the testing. It is an advantage that this can be achieved without significantly increasing the complexity of the sensor interface circuitry.

In embodiments of the present invention the test input is a signal which spans an operating range of the sensor interface circuit.

The test input may be a sine wave signal.

Alternatively, the test input the test input may comprise one or more constant signals. One of the one or more constant signals may be substantially zero.

In embodiments of the present invention the test circuit comprises a test input circuit. The test input circuit comprises switches for:
  connecting input pins of one of the sensor inputs to input contacts of one of the front end circuits for obtaining sensor signal acquisitions,
  connecting one of the input pins of the sensor input to both input contacts of the front end circuit, and disconnecting the other sensor input from the front end circuit, for obtaining the test result. The test input circuit may comprise a capacitor which can be connected to one of the input contacts.

In embodiments of the present invention the processing device is configured for comparing the sensor signal acquisitions by comparing their difference with a predefined threshold, and
  for determining that the sensor signal acquisitions are not reliable if the difference is larger than the threshold, and
  for determining that the sensor signal acquisitions are not reliable if the difference is smaller than the threshold and the test result of one of the front end circuits indicates that it is not correctly working, and
  for determining that the sensor signal acquisitions are reliable, if the difference is smaller than the threshold and the one or more test results of the tested one or more front end circuits indicates that they are correctly working.

In embodiments of the present invention the sensor interface circuit comprises a separate test input circuit per front end circuit or a single test input circuit for testing all front end circuits.

In embodiments of the present invention the processing device is configured for:
  comparing the sensor signal acquisitions from the at least two sensor inputs by comparing their difference with a predefined threshold and, if the difference is larger than the threshold,
  for determining that the sensor signal acquisitions are not reliable if at least one test result of each front end circuit indicates that all front end circuits are not correctly working or if the test results of all test input circuits indicate that all front end circuits are correctly working,
  for determining that the sensor signal acquisition of a front end circuit for which the test result indicates that it is correctly working should be used if the test result of at least one front-end circuit indicates that it is not correctly working,
  and, if the difference is smaller than the threshold, for obtaining the test result of one of the front end circuits and
  for determining that the sensor signal acquisitions are not reliable if the test result indicates that it is not correctly working,
  for determining that the sensor signal acquisitions are reliable if the test result indicates that it is correctly working.

In embodiments of the present invention the front end circuits may comprise an analog to digital converter (ADC).

In embodiments of the present invention the sensor system may comprise a controller configured for triggering the at least one test input circuit for obtaining a test result.

In embodiments of the present invention the sensor interface circuit comprises an external controller for controlling the sensor interface circuit.

In a second aspect embodiments of the present invention relate to a method for controlling the integrity of a sensor interface circuit which comprises at least two sensor inputs each configured to be connected with a different sensor for measuring a same physical parameter and each configured to be connected with a front end circuit for conditioning signals coming from the sensors, the method comprising:
  acquiring signals from the front end circuits, thus obtaining sensor signal acquisitions,
  intermittently applying a test signal to at least one of the front end circuits, and reading a test output of the front end circuit, induced by the test signal,
  comparing the test output with an expected result, thus obtaining at least one test result,
  comparing the sensor signal acquisitions from the different sensor inputs and combining the comparison with the at least one test result in order to evaluate correct functionality of the sensor interface circuit.

In embodiments of the present invention the method may be used for a sensor interface circuit which has front end circuits with differential inputs. In that case the method may comprise:
  connecting input pins of one of the sensor inputs to input contacts of one of the front end circuits for obtaining sensor signal acquisitions,
  connecting one of the input pins of the sensor input to both input contacts of the front end circuit, and disconnecting the other sensor input from the front end circuit, for obtaining the test result.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
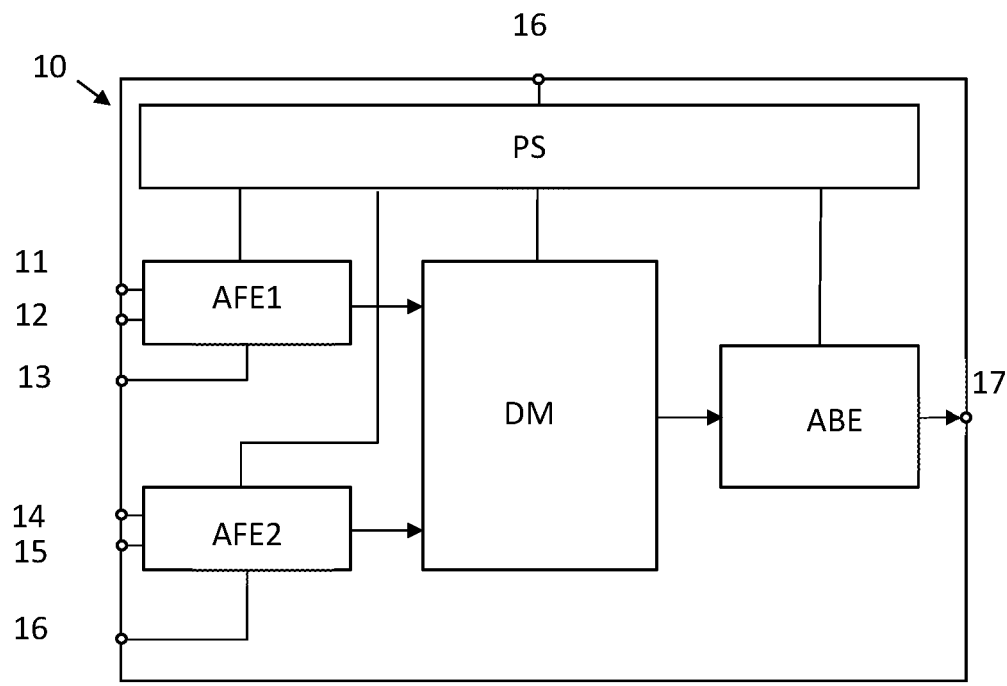
FIG. 1 show a schematic drawing of a typical prior art sensor interface circuit.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 2:
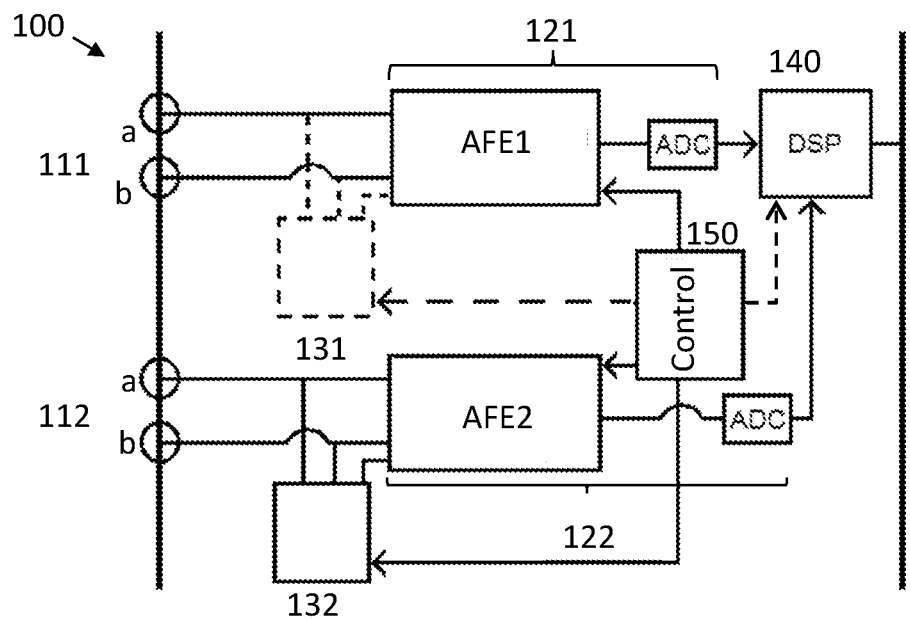
FIG. 2 shows a schematic drawing of a sensor interface circuit in accordance with embodiments of the present invention.

In a first aspect embodiments of the present invention relate to a sensor interface circuit 100. An example of such a sensor interface circuit is illustrated in FIG. 2. The sensor interface circuit 100 comprises at least two sensor inputs 111, 112 each configured to be connected to a separate sensor for measuring a same physical parameter.

The sensor interface circuit, moreover, comprises at least two front-end circuits 121, 122. Each sensor input 111, 112 is configured to be connected with one of the front end circuits 121, 122, and each front end circuit 121, 122 is configured for conditioning a signal from the connected sensor input, thus obtaining sensor signal acquisitions from the at least two sensor inputs. Thus, at least two signal paths are formed, each starting from a sensor input and going through a front end circuit. In embodiments of the present invention, the sensor interface circuit may comprise more than 2 sensor inputs and more than 2 signal paths may be present. The sensor interface circuit may for example comprise a multiplexer so that one or more front ends can connect with the sensor inputs. In some embodiments the sensor interface circuit may, for example, comprise 3 or more sensor inputs and 2 front-ends, wherein at least one front-end can read multiple sensors. In such a configuration each sensor may be measuring the same physical parameter.

The sensor interface circuit, moreover, comprises a test circuit comprising test input circuits 131, 132 configured to test correct functionality of at least part of one of the front end circuits 121, 122. The correct functionality may for example be tested by checking if the performance meets a predefined requirement. The functionality may be considered not correct if, for example, the performance does not meet one or more predefined thresholds. The test circuit may, therefore, be configured to apply a test input to the front end circuit under test, and to read a test output of the front end circuit. For example, a voltage or a current may be applied as test input. The test output is induced by the test input. The test circuit is configured to apply the test input intermittently between sensor signal acquisitions. The test circuit is configured for comparing the test output with an expected result thus obtaining at least one test result. The functionality of the test circuit may be distributed over different components. Reading of the test output and comparing the test output may for example be implemented in a processing device 140.

In embodiments of the present invention the sensor interface circuit 100 comprises a test input circuit 131, 132 for each front end circuit 121, 122.

In embodiments of the present invention the test signals of one test input circuit may be interleaved with the test signals of the other test input circuit. This allows to have the sensor signal acquisitions on at least one of the front end circuits.

The sensor interface circuit, moreover, comprises a processing device 140 configured for comparing the sensor signal acquisitions from the different sensor inputs and for combining the comparison with the at least one test result in order to evaluate correct functionality of the sensor interface circuit.

The front-end circuit comprises analog front-end circuitry for processing the sensor signal in the analog domain. That may include amplification, filtering or any other processing required.

In embodiments of the present invention the front-end circuit may additionally comprise an ADC for converting the output of the analog front-end into a digital representation. This digital representation may be used as input for the processing device.

The AD conversion is preferably done separately for the different signal paths and optionally also using different types of AD converters between the paths. In principle it is possible to use one AD converter and time multiplex between the analog outputs of the paths, but that would decrease the redundancy between the paths and thereby the safety integrity. Therefore, it is preferable (but not obliged) to have an AD converter per path.

In embodiments of the present invention at least two signal paths are present. A first path through a first sensor input and a first front end circuit, and a second path through a second sensor input and a second front end circuit. A test input circuit may be present in each path or there may be only one test input circuit.

In embodiments of the present invention the test input circuit may be applied only to the second path, or may be more thorough for the second path.

In some embodiments of the present invention the sensor interface may comprise a test input circuit only for the second path. The second front end circuit may be multiplexed between the signal coming from the sensor, and the test output. A slower update period for the sensor signal acquisitions may be done for the second path, so that the self-test using the test circuit can be performed between the updates.

The sensor signal acquisitions of the second path may alternate with the test output acquisitions. The overall update period of sensor signal acquisitions together with test output acquisitions of the second path may be the same as the update rate of the sensor signal acquisitions of the first path, but some of the samples would be related to the test circuit (also referred to as built-in self-test BIST) and some application related, so the update rate for the application related samples might be lower than in the first path.

In different applications the requirements for the second signal path, with respect to update rate, are not as stringent as for the first path. This allows to apply significantly more self-tests on the second front-end circuit (and optionally also the secondary sensor), than on the first front-end circuit. In such applications the test input circuit for the first path does not need to be implemented. For symmetry reasons, it may be present. In that case it may be disabled (during normal operation) to guarantee the full sensor signal update rate for the first path. It may for example be disabled during normal operation and enabled at start-up. In some embodiments of the present invention the check on the first analog front-end may be done on request (e.g., when there is some doubt about the correct performance).

The sensor interface circuit may be configured for triggering the test circuit for testing the correct functionality of the first and the second front end circuit at start-up or during production testing.

In embodiments of the present invention the interface circuit comprises a controller 150 configured for triggering the at least one test input circuit 131, 132 for obtaining a test result.

In embodiments of the present invention the controller and the processing device may be the same device. For example, a microprocessor, a field programmable gate array or a digital signal processor may be used. They may also be separate devices.

The controller 150 configured for triggering the at least one test input circuit 131, 132 may also control the front end circuits and is also referred to as the front-end control block. An example of such a control block 150 is shown in FIG. 2. In FIG. 2 the operation of the test input circuit(s) is controlled by a controller inside the sensor interface circuit (this may be in the same chip/die). The sensor interface circuit may be configured for disconnecting the sensor signal from the front end circuit when the test input circuit is triggered to test correct functionality of the corresponding front-end circuit. This can be implemented using switches, which are controlled from the controller 150.

The test circuit is configured to test correct functionality (e.g., performance) of at least part of a front end circuit. The test input circuit might, for example, not be fully before the Analog front-end (AFE), as show in FIG. 2, but rather be part of it. For example, filtering of the signal from the sensor input may be done by a filter circuit at the beginning of the analog front-end. Then it might be best for EMC reasons to have no switches or other active components before this filter. In that case also the test input circuit is preferably implemented after the filter. Additionally, the test input circuit may be configured for testing also the ADC converter of the front end circuit.

As will be discussed later the test circuit may be configured for modifying a front end circuit in order to obtain an oscillating front end circuit (the analog part of the front end circuit is oscillating).

In embodiments of the present invention comparing the test output with an expected result thus obtaining at least one test result may be implemented in the processing device. The controller 150 may therefore indicate to the processing device 140 which test input is applied at which moment. This is indicated by the dashed line from the controller 150 to the processing device 140.

In embodiments of the present invention the outputs of the front end circuits 121, 122 comprise ADCs for converting the analog outputs of the analog front-ends into a digital signal for the processing device 140 (e.g., a DSP block). This processing device is configured to process the outputs of the front-end circuits 121, 122. The processing device may be configured for detecting faulty operation of the analog front-ends e.g., by comparing the outputs of the two paths and combining it with the result of the test circuit operation.

The test result of the test circuit operation may be PASS or FAIL, or in some implementations e.g., UNCERTAIN. In that case the sensor interface circuit may be configured for doing a more detailed testing of the second front-end circuit at the cost of interrupting the sensor signal acquisitions for this second front-end circuit, e.g., triggering the test input circuit for running the oscillation test (which will be discussed later in the description). In that case the sensor interface circuit may also be configured for running a test with the test input circuit of the first front-end circuit.

In embodiments of the present invention the Front-end control and DSP blocks in the interface circuit die can be implemented in one block, or their functionality can be distributed over different processing devices. The test circuit comprises a test input circuit 131, 132 to provide the test input to the device under test, e.g., front end circuit. Furthermore, the test circuit comprises additional functionalities, e.g., comparison of the output of the device under test with test input to the expected output, or triggering of the test input to the device under test. These functionalities can be implemented in the test input circuit or in the shared circuitry of the distributed processing devices.

A test input circuit may be implemented separately for each path, or a test input circuit may be shared between paths or part of the test input circuits may be shared. In embodiments of the present invention the test input may for example be applied simultaneously to both paths or in a time multiplexed manner. Even though the blocks in FIG. 2 representing the test input circuits 131, 132 are drawn as separate blocks, part of their functionality may be implemented as shared circuitry. In FIG. 2 the block 131 representing the test circuit for the first path is drawn in dashed lines for indicating that it is optional.

Figure 3:
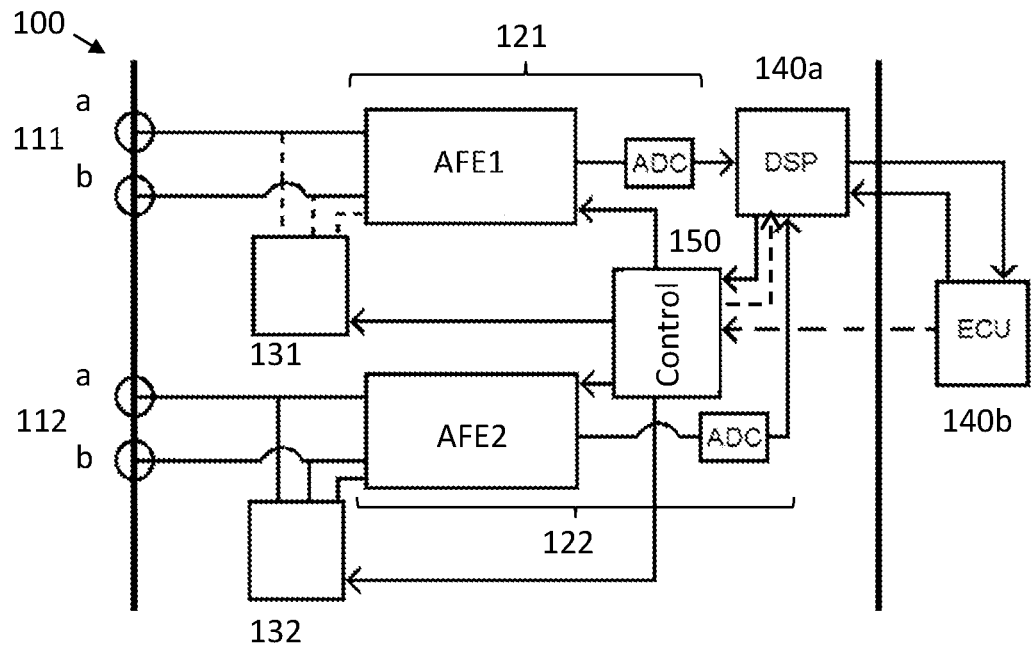
FIG. 3 shows a schematic drawing of a sensor interface circuit comprising an external controller in accordance with embodiments of the present invention.

In the exemplary embodiment, shown in FIG. 3, the built-in self-tests are performed on both front-end circuits of the sensor interface circuit. It might be advantageous however to have one of the front-ends working in normal application mode while the other is being tested, so that at every moment at least one of the two sensor signals is available.

In embodiments of the present invention the sensor interface circuit is configured for connecting an external controller for controlling the sensor interface circuit. The test circuit may for example be triggered using an external controller. The comparison of the sensor signal acquisitions and the comparison of the test output with the expected result and the combination of the test result with the comparison of the sensor signal acquisitions may be done internally, on a separate die or chip (e.g., at an external controller) or both internally and externally. This is illustrated in FIG. 3 where the processing device is a distributed device comprising an internal controller 140a (e.g., a DSP) and an external controller 140b. Both may be implemented on separate chips/dies. In the example of FIG. 3 the external controller is an Engine Control Unit (ECU). As described earlier, the DSP block may perform the analysis between the outputs of the two signal paths and convey the result of the comparison to external controller. In some embodiments of the present invention the comparison result may be combined with the test result in the DSP block and the combined output may be communicated to the external controller (the processing device is a distributed device). In embodiments of the present invention the output values of the two paths (the sensor signal acquisitions) and the test result may all be communicated to the external controller, but that requires larger bandwidth for the data compared to that part of the processing is done before transferring the data.

As explained before, the external controller 140b may optionally be used for triggering the test operation. This may for example be done when there is doubt about the correct operation of the front-end circuits (e.g., the analog parts of the front-end circuits). In embodiments of the present invention the external controller may be configured for requesting the test operation by communicating with an internal controller (e.g., DSP) which in turn is connected to the Front-end control block 150. The connection from the external controller may also be directly to Front-end control block 150, or even directly to the test input circuit(s).

Figure 4:
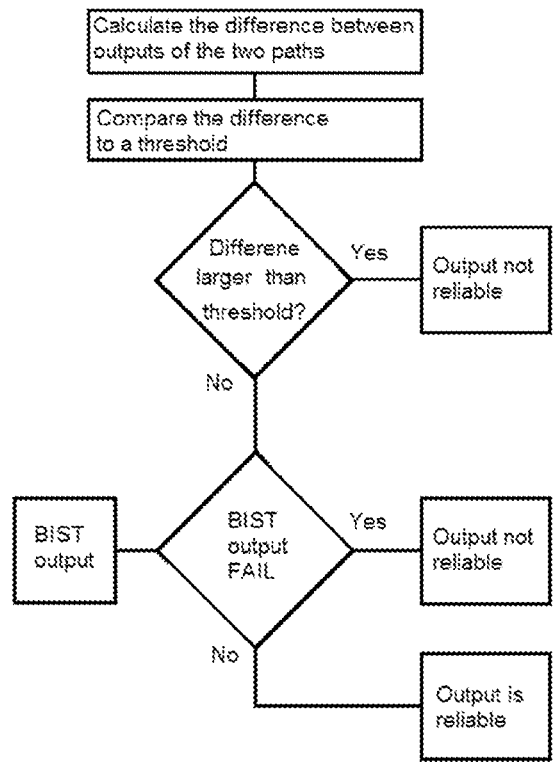
FIG. 4 and FIG. 5 shows typical method steps, which may be implemented in a sensor interface circuit in accordance with embodiments of the present invention.

The processing device may be configured for executing a method comprising the following steps (a flow chart of an exemplary method, in accordance with embodiments of the present invention, is illustrated in FIG. 4). The processing device may be configured for comparing the sensor signal acquisitions by comparing their difference with a predefined threshold, and for determining that the sensor signal acquisitions are not reliable if the difference is larger than the threshold, and for determining that the sensor signal acquisitions are not reliable if the difference is smaller than the threshold and the test result of one of the front end circuits indicates that it is not correctly working, and for determining that the sensor signal acquisitions are reliable, if the difference is smaller than the threshold and the one or more test results of the tested front end circuit(s) indicate that it is (they are) correctly working.

It is an advantage of embodiments of the present invention that errors in the front end circuit, which would remain unnoticed when comparing differences between sensor signal acquisitions, can be detected by a test circuit in accordance with embodiments of the present invention.

With two front-ends it is possible to detect a fault in one of the two front-ends by comparing the result of both front ends. But both front-ends could suffer from the same or a similar fault, because there might be some correlation between the front-ends. If, for example, the second front-end is tested extensively during operation of the sensor interface circuit, faults can be detected in the second analog front-end. If there is a correlation between the front-ends, correlated faults can be detected which happen simultaneously in both front-ends.

It is an advantage of embodiments of the present invention that the test circuit, and the corresponding test operations, allow to detect dependent faults which influence both analog front-ends. It is thereby noted that faults which influence only one front-end are anyhow detected by comparing the signal acquisitions of both front ends, because both sensors are measuring the same physical parameter, so the outputs of the front ends should be the same.

Some examples of dependent faults are:

EMC events (EMC events can be coupled in at the sensor inputs or the can also couple in at other positions such as for example through the supply);

Low or disturbed supply voltage;

Leakage current or other process deviation of a component (e.g., MIM capacitor) used in both front-ends;

Drift over life (the design is not robust against drift over life).

It is an advantage of embodiments of the present invention that the availability of the sensor interface circuit can be increased using the invention. If a difference between both front-ends is detected, but if one front-end is proven to be faultless, then this front-end can still be used to produce the output signal. This is shown in FIG. 5.

Figure 5:
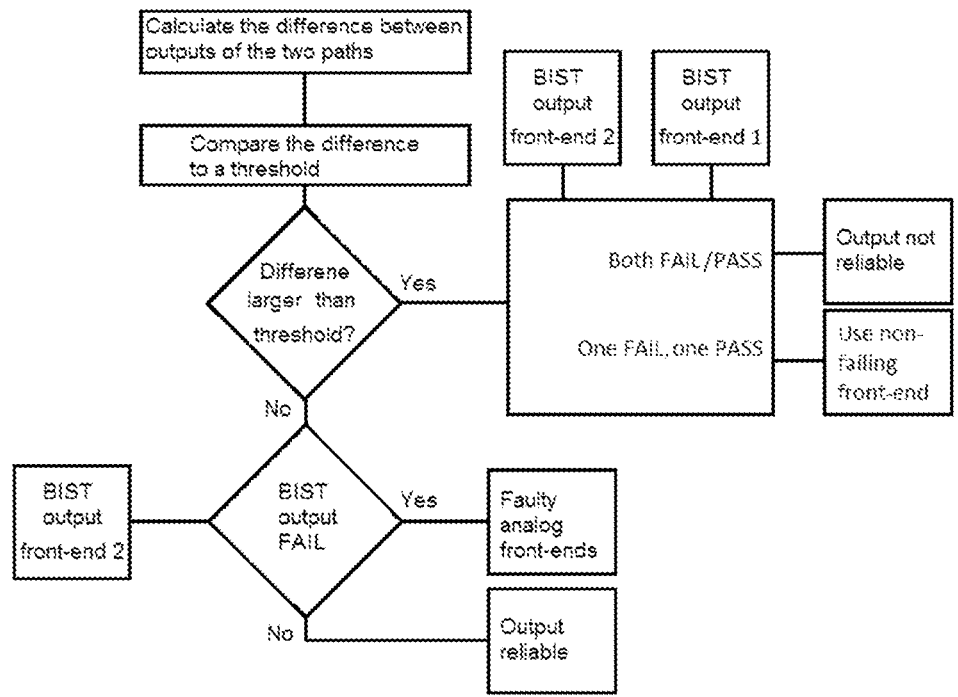

The flow-chart in FIG. 5 illustrates an exemplary method, in accordance with embodiments of the present invention. The processing device is configured for comparing the sensor signal acquisitions of both front ends. If the difference is larger than a predefined threshold, the processing device concludes that the sensor signal acquisitions are not reliable if the test results of both front ends with a test input from test input circuits indicate that both front end circuits are not correctly working or if the test results of both front ends with a test input from test input circuits indicate that both front end circuits are correctly working. If both front ends fail the tests with a test input from test input circuits, it can be concluded that the output is not reliable which is potentially due to a common cause. If both front ends pass, the sensor signal acquisitions (the outputs) are not reliable, probably due to a part which is not covered by the test circuit (e.g., sensor itself, if the sensor is not covered by the test circuit).

If one front end circuit passes the test, and the other front end-circuit fails the test the front-end circuit that passes can be used to generate the output. It should be noted that in this case reliability is reduced. This may be flagged by the processing device to indicate a decrease in reliability of the sensor interface circuit. Indeed, in case of a two sensor system with one path failing, an additional fault (e.g., drift of the sensor) would not be detected anymore.

If the difference is smaller than the predefined threshold the conclusion of the processing device is dependent on the test result of the second front end (in the example the second front end is tested, but this may also be another front end). If this test result is faulty, it is concluded that both analog front ends are faulty. If the test result is OK, it is concluded that the output is reliable.

Optionally, instead of testing only one front end, all front ends may be tested if the difference between the sensor signal acquisitions is smaller than the predefined threshold.
In that case the following may be concluded:
if the test result of one of them is still OK, then it may be concluded that the output of that one is reliable;
if the test result of all are OK, then it may be concluded that the outputs of all front ends are reliable;
if the test results of all are not OK, then it may be concluded that all outputs are unreliable.

This may for example apply in case of two front ends of which a first front end works 100% correct and a second front end works for small input signals but not for big signals (e.g., clamping or gain error). If the application input at that moment is small, then both will give a correct output and their difference is small. Still the second front end could fail the BIST. Although the second front end is working correctly at a moment when the application input is small, it is not reliable anymore when the application input is big.

In embodiments of the present invention the test circuit(s) may not only be configured to test correct functionality of the front end circuit, but also of the sensor itself.

Faults which are externally induced, such as EMC events might create a big disturbance on the sensor inputs which are connected to the sensor. These errors may be momentary, but they can last long enough to cause a safety issue. If the inputs from the sensor are replaced with an internal test signal to check the correct working of the front-end, such an error might be unnoticed. Note that the EMC disturbance is in most cases mainly a common mode signal. There might be also a small differential signal created, e.g., due to some differences in parasitic capacitances. One should however always attempt (by design) to make the sensor element, the read-out circuitry and the connections of the differential input as symmetrical as possible. Still one can get errors because the disturbance can be that big, so that the common mode input range of the analog front-end is exceeded, which will cause deviations of its output.

To detect such disturbances, a test circuit according to embodiments of the present invention is configured, to apply test inputs derived from the real input pins instead of, or besides applying internally generated test inputs.

Figure 6:
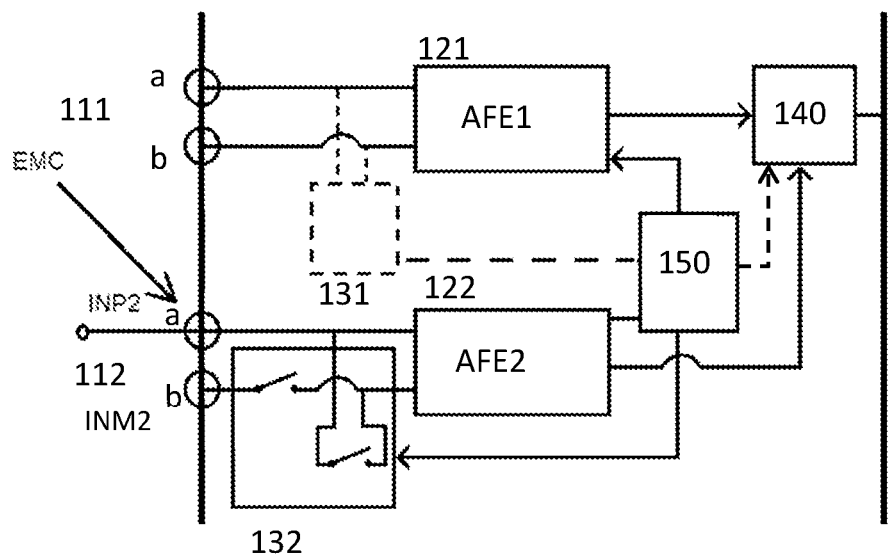
FIG. 6 shows a schematic drawing of a sensor interface circuit wherein the test input circuit comprises switches, in accordance with embodiments of the present invention.

Therefore, in embodiments of the present invention a test input may be generated by connecting input nodes (2 input nodes for receiving a differential signal) of a front-end to the same input pin of the interface circuit (e.g., INP2 pin in FIG. 6). In this configuration, the test signal is differentially 0, but it has a common mode equal to one of the input pins that can be disturbed by EMC. This is illustrated in FIG. 6, in which the secondary path test input circuit also comprises a switching configuration to connect the input nodes to the same potential. Naturally, depending to which of the input pins provides the common potential, the other one needs to be disconnected from the measurement.

Figure 7:
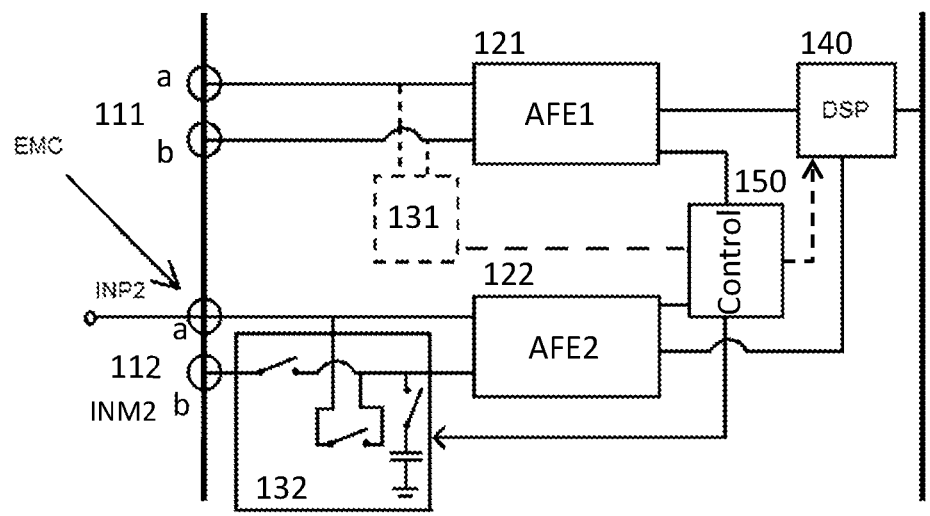
FIG. 7 shows a schematic drawing of a sensor interface circuit wherein the test input circuit additionally comprises a capacitor, in accordance with embodiments of the present invention.

In general, as also illustrated in FIG. 7, the test input circuit 131, 132 may comprise switches for:
connecting input pins of one of the sensor inputs 112 to input contacts of one of the front end circuits 122 for obtaining sensor signal acquisitions,
connecting one of the input pins of the sensor input 112 to both input contacts of the front end circuit 122, and disconnecting the other sensor input 112 from the front end circuit 122, for obtaining the test result.

For simplicity of the figures an AD converter is not shown in FIG. 6 and FIG. 7. The AD converter can for example be positioned before the inputs of the processing device 140 or may be part of the processing device 140.

It is, thereby, an advantage of embodiments of the present invention that errors in the sensor signal due to EMC events can be detected.

Optionally a small asymmetry may be created between both sides of the differential test signal path by adding for example a small capacitance on one side only, to mimic the worst case asymmetry on the real sensor signal path. Optionally there could be a RC-filter instead of a single capacitance, but in practice the resistance of the switch might be sufficient so that only the capacitance is needed. The capacitor may for example have a capacitance smaller than 1 pF or even smaller than 100 fF.

A further alternative way to detect EMC influence could be done by adding (or removing) some extra capacitance (or RC) in e.g., the INM2 line only, without shorting INP2 and INM2. Without EMC (and suppose that the useful signal is not changing very fast) both front-end circuits should still give the same results. It is easier, but the disadvantage is that the "availability" of the system might drop, as an EMC issue might already be detected while it is not yet an issue for the normal application.

In embodiments of the present invention the test input circuit may be configured to apply a stable zero differential input which is created internally. The test circuit may be configured for comparing the outputs of both tests with shorted inputs, which should normally generate the same result.

Such a configuration relating to detection of the EMC is, wherein the test input circuit comprises switches and a switchable capacitor is pictured in FIG. 7.

The test input circuit, in this figure, additionally comprises the capacitor (or RC filter) which can be connected to one of the input contacts. This has as advantage that the sensitivity for EMC events is increased even more. The capacitor (or RC filter) may, for example, be connected between one of the input contacts and the ground or another reference voltage. The RC filter may be a low-pass filter.

Besides applying a zero differential input and checking the output versus the expected result, a test input circuit according to embodiments of the present invention may also be configured to apply additional input signals to increase the coverage.

In embodiments of the present invention the test input may for example be a signal which spans an operating range of the sensor interface circuit. In a preferred embodiment the full input range of the analog front-end is covered by the test input. It is an advantage of embodiments of the present invention that correct operation of the front end circuit is tested for the complete operating range of the front end circuit. In embodiments of the present invention not only 0 may be applied as differential input, but also for example a signal close to the full scale of the sensor. If the sensor is supplied by analog regulator with a voltage VDDA (and assuming that the sensor output is proportional to its supply), then the test input circuit may be configured to generate internally a differential signal of 10% VDDA. With one signal pure gain errors cannot be detected. If a good coverage is required for non-linearity errors, then the test input circuit needs to be configured for more than 2 signals (preferably significantly more than 2 signals), e.g., 1% VDDA, 2% VDDA, etc.

In most cases the sensor interface has low bandwidth requirements, so it might be good enough to apply only DC signals as test inputs. One or more constant signals may be applied. The levels of the constant signals may be such that they span the operating range of the sensor interface circuit. Applying constant signal(s) has the advantage that the inputs can be easily generated and the output can also be easily checked. In other cases, it might be needed to apply also varying signals, e.g., a sine wave needs to be applied. The output can be checked for example by doing a fast fourier transform (FFT) to check the frequency spectrum.

Above examples are functional tests, as they check the normal function of the component. In some cases, structural tests could help to find defects (potentially in combination with some functional tests). Therefore, the test input circuit may be configured for modifying the front-end circuit such that it starts to oscillate. For example, an amplifier of the front-end circuit may be configured with positive feedback while in normal application it uses negative feedback. The advantage is that the test input is inherently generated as a consequence of the oscillation. In such embodiments the test output may comprise the frequency and amplitude of the oscillation. Such an oscillating signal may also be used to test the ADC.

In embodiments of the present invention the processing device is configured for comparing the sensor signal acquisitions from the different sensor inputs. Their difference may for example be compared with a threshold. The threshold may be predefined.

The sensor performance may influence the safety of the interface circuitry. When comparing 2 front-end outputs, the predefined threshold may be dependent on the difference that can be expected between the two inputs coming from the sensor without a fault being present.

If for example the two sensor inputs could drift (without fault) 1% each, and the difference between these 2 sensor signals could drift 1.5%, then the difference between the 2 outputs of the processed sensor signals can also drift 1.5% without any fault in the interface circuitry used for the sensor processing. So, the threshold for the output comparison should be at least 1.5% of the full scale signal range, normally even more to give some headroom for the interface circuitry. This means that faults in the interface causing an error of 1.5% or less cannot be detected. Even faults in the interface causing an error of 3% might be not detected if the sensor drifted 1.5% in the opposite direction. Typically, one likes to detect smaller deviations of the interface chip.

Therefore, in some embodiments of the present invention, the processing device is configured for compensating the sensor drift. This may for example be achieved by auto-zeroing. This means that the processing device measures the drift at a certain moment and subtracts it from the results for the following measurements. This can be repeated periodically. This can be done on the 2 outputs (the signal acquisitions for the different sensors) separately if the physical input is known. It can also be done on the difference between both outputs, which has the advantage that the physical input does not need to be known (assuming that both sensors measure the same physical input).

In embodiments of the present invention the processing device may be configured for checking the output difference without drift compensation and the output difference with drift compensation, each with its own threshold. Instead of checking the drift without compensation, the processing device may be configured to check the magnitude of the needed compensation, which is basically the inverse of the drift.

The check without compensation is done to check the drift of the sensor, which is typically slow. The check with compensation can use more tight limits to cover the interface circuit and fast drifts of the sensor. Instead of measuring the drift and compensating for it at one or few discrete moments, the processing device may be configured for tracking the slow drift of the sensor. The sensor interface circuit may comprise a lowpass filter with sufficiently high time constant (e.g., 1 minute) to reduce the influence of fast changes due to internal or external faults, including EMC induced deviations.

In some cases, it is also possible that there are more than two sensors which share two analog front-ends—e.g., 3 sensors and 2 front ends In embodiments of the present invention the analog front ends may have the same design.

The separate sensors may each be present on a separate die. Alternatively, the separate sensors may be present on a single die with a single membrane, where the different sensors are just using a different set of piezo-resistors.

In a second aspect embodiments of the present invention relate to a method for controlling the integrity of a sensor interface circuit which comprises at least two sensor inputs each configured to be connected with a different sensor for measuring a same physical parameter and each configured to be connected with a front end circuit for conditioning signals coming from the sensors. In analogy with the sensor interface circuit, which is extensively described above, the method comprises:
  acquiring signals from the front end circuits, thus obtaining sensor signal acquisitions,
  intermittently applying a test signal to at least one of the front end circuits, and reading a test output of the front end circuit, induced by the test signal,
  comparing the test output with an expected result, thus obtaining at least one test result,
  comparing the sensor signal acquisitions from the different sensor inputs and combining the comparison with the at least one test result in order to evaluate correct functionality of the sensor interface circuit.

In embodiments of the present invention the method may comprise:
  connecting input pins of one of the sensor inputs to input contacts of one of the front end circuits for obtaining sensor signal acquisitions,
  connecting one of the input pins of the sensor input to both input contacts of the front end circuit, and disconnecting the other sensor input from the front end circuit, for obtaining the test result.

A method, in accordance with embodiments of the present invention, may comprise additional features which are also described in the description above.

The invention claimed is:

1. A sensor interface circuit comprising:
   at least two sensor inputs each configured to be connected to a separate sensor for measuring a same physical parameter;
   at least two front-end circuits, wherein each sensor input is configured to be connected with one of the front-end circuits, and wherein each front-end circuit is configured for conditioning a signal from the connected sensor input, thus obtaining sensor signal acquisitions from the at least two sensor inputs;
   a test circuit configured to test correct functionality of at least part of one of the front-end circuits by applying a test input to the front-end circuit under test using a test input circuit, by reading a test output of the front-end circuit, wherein the test output is induced by the test input, and by comparing the test output with an expected result thus obtaining at least one test result, wherein the test input is applied intermittently between sensor signal acquisitions; and
   a processing device configured for comparing the sensor signal acquisitions from the different sensor inputs and for combining the comparison with the at least one test result in order to evaluate correct functionality of the sensor interface circuit.

2. The sensor interface circuit according to claim 1, wherein the test input is a signal which spans an operating range of the sensor interface circuit.

3. The sensor interface circuit according to claim 1, wherein the test input is a sine wave signal.

4. The sensor interface circuit according to of the claim 1, wherein the test input comprises one or more constant signals.

5. The sensor interface circuit according to claim 4, wherein one of the one or more constant signals is substantially zero.

6. The sensor interface circuit according claim 1, wherein the test input circuit comprises switches for:
   connecting input pins of one of the sensor inputs to input contacts of one of the front-end circuits for obtaining sensor signal acquisitions; and
   connecting one of the input pins of the sensor input to both input contacts of the front-end circuit, and disconnecting the other sensor input from the front-end circuit, for obtaining the test result.

7. The sensor interface circuit according to claim 6, wherein the test input circuit further comprises a capacitor which can be connected to one of the input contacts.

8. The sensor interface circuit according to claim 1, wherein the processing device is further configured for comparing the sensor signal acquisitions by comparing their difference with a predefined threshold, and
   for determining that the sensor signal acquisitions are not reliable if the difference is larger than the threshold, and
   for determining that the sensor signal acquisitions are not reliable if the difference is smaller than the threshold and the test result of one of the front-end circuits indicates that it is not correctly working, and
   for determining that the sensor signal acquisitions are reliable, if the difference is smaller than the threshold and the one or more test results of the tested one or more front-end circuits indicates that they are correctly working.

9. The sensor interface circuit according to claim 1, wherein the sensor interface circuit further comprises a separate test input circuit per front-end circuit or a single test input circuit for testing all front-end circuits.

10. The sensor interface circuit according to claim 9, wherein the processing device is further configured for:
    comparing the sensor signal acquisitions from the at least two sensor inputs by comparing their difference with a predefined threshold and, if the difference is larger than the threshold,
       for determining that the sensor signal acquisitions are not reliable if at least one test result of each front-end circuit indicates that all front-end circuits are not correctly working or if the test results indicate that all front-end circuits are correctly working,
       for determining that the sensor signal acquisition of a front-end circuit for which the test result indicates that it is correctly working should be used if the test result of at least one front-end circuit indicates that it is not correctly working,
    and, if the difference is smaller than the threshold, for obtaining the test result of one of the front-end circuits and
       for determining that the sensor signal acquisitions are not reliable if the test result indicates that it is not correctly working,
       for determining that the sensor signal acquisitions are reliable if the test result indicates that it is correctly working.

11. The sensor interface circuit according to claim 1, wherein the front-end circuits comprise an analog to digital converter (ADC).

12. The sensor interface circuit according to claim 1, wherein the sensor system further comprises a controller configured for triggering the at least one test circuit for obtaining a test result.

13. The sensor interface circuit according to claim 1 which is configured for connecting an external controller for controlling the sensor interface circuit.

14. A method for controlling the integrity of a sensor interface circuit which comprises at least two sensor inputs each configured to be connected with a different sensor for measuring a same physical parameter and each configured to be connected with a front-end circuit for conditioning signals coming from the sensors, the method comprising:
    acquiring signals from the front-end circuits, thus obtaining sensor signal acquisitions;
    intermittently applying a test signal to at least one of the front-end circuits, and reading a test output of the front-end circuit, induced by the test signal;
    comparing the test output with an expected result, thus obtaining at least one test result; and
    comparing the sensor signal acquisitions from the different sensor inputs and combining the comparison with the at least one test result in order to evaluate correct functionality of the sensor interface circuit.

15. The method according to claim 14, wherein for a sensor interface circuit which has front-end circuits with differential inputs, the method further comprises:
    connecting input pins of one of the sensor inputs to input contacts of one of the front-end circuits for obtaining sensor signal acquisitions; and
    connecting one of the input pins of the sensor input to both input contacts of the front-end circuit, and disconnecting the other sensor input from the front-end circuit, for obtaining the test result.

\* \* \* \* \*